(12) United States Patent
Chern et al.

(10) Patent No.: US 11,114,442 B2
(45) Date of Patent: Sep. 7, 2021

(54) SEMICONDUCTOR MEMORY DEVICE WITH SHALLOW BURIED CAPACITOR AND FABRICATION METHOD THEREOF

(71) Applicant: HeFeChip Corporation Limited, Sai Ying Pun (HK)

(72) Inventors: Geeng-Chuan Chern, Cupertino, CA (US); Liang-Choo Hsia, Hsinchu (TW)

(73) Assignee: HeFeChip Corporation Limited, Sai Ying Pun (HK)

( * ) Notice: Subject to any disclaimer, the term of this patent is extended or adjusted under 35 U.S.C. 154(b) by 0 days.

(21) Appl. No.: 16/711,439

(22) Filed: Dec. 12, 2019

(65) Prior Publication Data
US 2021/0183867 A1  Jun. 17, 2021

(51) Int. Cl.
*H01L 27/108* (2006.01)

(52) U.S. Cl.
CPC .... *H01L 27/10832* (2013.01); *H01L 27/1087* (2013.01); *H01L 27/10873* (2013.01)

(58) Field of Classification Search
None
See application file for complete search history.

(56) References Cited

U.S. PATENT DOCUMENTS

| 5,290,726 | A | 3/1994 | Kim |
| 5,753,559 | A * | 5/1998 | Yew ........................ H01L 28/84 |
| | | | 257/E21.013 |
| 5,903,024 | A | 5/1999 | Hsu |
| 5,945,703 | A * | 8/1999 | Furukawa ......... H01L 27/10861 |
| | | | 257/301 |
| 6,008,515 | A | 12/1999 | Hsia |
| 7,276,751 | B2 | 10/2007 | Ho |
| 7,682,896 | B2 | 3/2010 | Ho |
| 2003/0042519 | A1 | 3/2003 | Tzeng |
| 2009/0236691 | A1 | 9/2009 | Dyer |
| 2011/0073994 | A1 | 3/2011 | Liu |

\* cited by examiner

*Primary Examiner* — Anthony Ho
*Assistant Examiner* — Kevin Quinto
(74) *Attorney, Agent, or Firm* — Winston Hsu

(57) ABSTRACT

A semiconductor device includes a bottle-shaped capacitor cavity extends through a silicon device layer and a buried oxide layer of a substrate. The bottle-shaped capacitor cavity includes an upper portion in the silicon device layer and a widened bottom burrow in the buried oxide layer and underneath the silicon device layer. The widened bottom burrow is wider than the upper portion. A buried capacitor is disposed in the bottle-shaped capacitor cavity. The buried capacitor includes an inner electrode and an outer electrode with the capacitor dielectric layer therebetween. A transistor is disposed on the substrate. The transistor includes a source region and a drain region, a channel region between the source region and the drain region, and a gate over the channel region. The source region is electrically connected to the inner electrode.

26 Claims, 15 Drawing Sheets

SEMICONDUCTOR MEMORY DEVICE WITH SHALLOW BURIED CAPACITOR AND FABRICATION METHOD THEREOF

BACKGROUND OF THE INVENTION

1. Field of the Invention

The present disclosure relates generally to the field of semiconductor technology. More particularly, the present disclosure relates to a semiconductor memory device with shallow buried capacitor and a method for fabricating the same.

2. Description of the Prior Art

Dynamic random access memories (DRAMs) are employed in devices such as processors and application specific integrated circuits (ASICs).

A DRAM cell typically comprises a transistor and a trench or stacked capacitor. The stacked capacitor is formed after transistor formation. Thus the process steps and heat cycles required to form stacked capacitor have significant impacts on the transistor performance. This is a disadvantage for embedded applications. The trench capacitor is formed prior to transistor formation and, therefore, has no impact on the transistor performance, resulting in big advantages for embedded applications.

The trench capacitor is a three dimensional device formed by etching a trench into a semiconductor substrate. A capacitor dielectric layer is formed on the inner walls of the trench. The trench is then filled with an electrically conductive material such as heavily-doped polysilicon, which functions as one electrode of the trench capacitor while an N-type doped region surrounding the lower portion of the trench functions as the second electrode thereof. A transistor can then be formed above and in electrical communication with the trench capacitor.

It is desirable to improve the capacitance per unit area for compensating area loss due to dimension reduction of unit DRAM cells. Current approach to the improvement on the capacitance per unit area for the trench capacitor is to increase the trench depth. However, as the geometry becomes smaller, increasing the trench depth (to several µm deep) has great difficulties for trench formation, as well as capacitor dielectric and inner electrode formation, due to high aspect ratio. Besides, deep trenches lead to increase of serial resistance and thus, increased charging time.

Therefore, there is a need in this technical field to provide an improved semiconductor memory device having a buried capacitor with increased capacitor surface area without the need to form the deep trench capacitor for DRAMs.

SUMMARY OF THE INVENTION

It is one objective of the present disclosure to provide a structure, as well as method of fabricating same, of a buried capacitor with increased capacitor surface area and high capacitance value without forming the deep trench for DRAMs.

One aspect of the present disclosure provides a semiconductor device including a substrate comprising a semiconductor substrate, a buried oxide layer on the semiconductor layer, and a silicon device layer on the buried layer. At least one bottle-shaped cavity extends through the silicon device layer and the buried oxide layer. The at least one bottle-shaped cavity is comprised of an upper portion disposed in the silicon device layer and a widened bottom burrow disposed in the buried oxide layer and underneath the silicon device layer. The widened bottom burrow is wider than the upper portion. At least one buried capacitor is located in the at least one bottle-shaped cavity. The at least one buried capacitor comprises an inner electrode and an outer electrode with a capacitor dielectric layer therebetween. At least one transistor is disposed on the substrate. The at least one transistor comprises a source region and a drain region disposed in the silicon device layer, a channel region between the source region and the drain region, and a gate over the channel region. The source region is electrically connected to the inner electrode of the at least one buried capacitor.

According to some embodiments, a lower surface of the silicon device layer, a side surface of the buried oxide layer and an upper surface of the semiconductor substrate constitute an interior surface of the widened bottom burrow.

According to some embodiments, the outer electrode conformally covers the lower surface of the silicon device layer, the side surface of the buried oxide layer and the upper surface of the semiconductor substrate within the widened bottom burrow.

According to some embodiments, an oxide layer is disposed on the lower surface of the silicon device layer and the upper surface of the semiconductor substrate within the widened bottom burrow.

According to some embodiments, the oxide layer has a thickness of about 2-8 nm.

According to some embodiments, the outer electrode is in direct contact with the oxide layer within the widened bottom burrow.

According to some embodiments, the semiconductor device further comprises an N$^+$ doped region disposed in the upper surface of the semiconductor substrate within the widened bottom burrow.

According to some embodiments, the outer electrode is in direct contact with the N$^+$ doped region within the widened bottom burrow.

According to some embodiments, the outer electrode protrudes beyond a sidewall surface of the upper portion of the at least one bottle-shaped capacitor cavity.

According to some embodiments, the outer electrode comprises an N-type polysilicon with rugged surface.

According to some embodiments, the widened bottom burrow of the cavity is completely filled with the outer electrode, the capacitor dielectric layer and the inner electrode.

According to some embodiments, the semiconductor device further comprises a conductive material layer embedded within the upper portion of the at least one bottle-shaped cavity. The inner electrode is in direct contact with the conductive material layer.

According to some embodiments, the source region is electrically connected to the conductive material layer.

According to some embodiments, the semiconductor device further comprises a silicide layer on the source region, the drain region, the gate and the conductive material layer.

According to another aspect of the invention, a method for forming a semiconductor device is disclosed. A substrate is provided. The substrate comprises a semiconductor substrate, a buried oxide layer on the semiconductor layer, and a silicon device layer on the buried layer. At least one bottle-shaped capacitor cavity is formed in the substrate. The at least one bottle-shaped capacitor cavity extends through the silicon device layer and the buried oxide layer. The at least one bottle-shaped capacitor cavity is comprised of an upper portion disposed in the silicon device layer and a widened bottom burrow disposed in the buried oxide layer and underneath the silicon device layer. The widened bottom burrow is wider than the upper portion. At least one buried capacitor is formed in the at least one bottle-shaped capacitor cavity. The at least one buried capacitor comprises an inner electrode and an outer electrode with a capacitor dielectric layer therebetween. At least one transistor is formed on the substrate. The at least one transistor comprises a source region and a drain region disposed in the silicon device layer, a channel region between the source region and the drain region, and a gate over the channel region. The source region is electrically connected to the inner electrode of the at least one buried capacitor.

According to some embodiments, a lower surface of the silicon device layer, a side surface of the buried oxide layer and an upper surface of the semiconductor substrate constitute an interior surface of the widened bottom burrow.

According to some embodiments, the outer electrode conformally covers the lower surface of the silicon device layer, the side surface of the buried oxide layer and the upper surface of the semiconductor substrate within the widened bottom burrow.

According to some embodiments, the method further comprises: forming an oxide layer on the lower surface of the silicon device layer and the upper surface of the semiconductor substrate within the widened bottom burrow.

According to some embodiments, the oxide layer has a thickness of about 2-8 nm.

According to some embodiments, the outer electrode is in direct contact with the oxide layer within the widened bottom burrow.

According to some embodiments, the method further comprises: forming an $N^+$ doped region in the upper surface of the semiconductor substrate within the widened bottom burrow.

According to some embodiments, the outer electrode is in direct contact with the $N^+$ doped region within the widened bottom burrow.

According to some embodiments, the outer electrode protrudes beyond a sidewall surface of the upper portion.

According to some embodiments, the outer electrode comprises an N-type polysilicon with rugged surface.

According to some embodiments, the widened bottom burrow is completely filled with the outer electrode, the capacitor dielectric layer and the inner electrode.

According to some embodiments, the method further comprises: forming a conductive material layer embedded within the upper portion. The inner electrode is in direct contact with the conductive material layer.

According to some embodiments, the source region is electrically connected to the conductive material layer.

According to some embodiments, the method further comprises: forming a silicide layer on the source region, the drain region, the gate and the conductive material layer.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. In the drawings.

Figure 1:
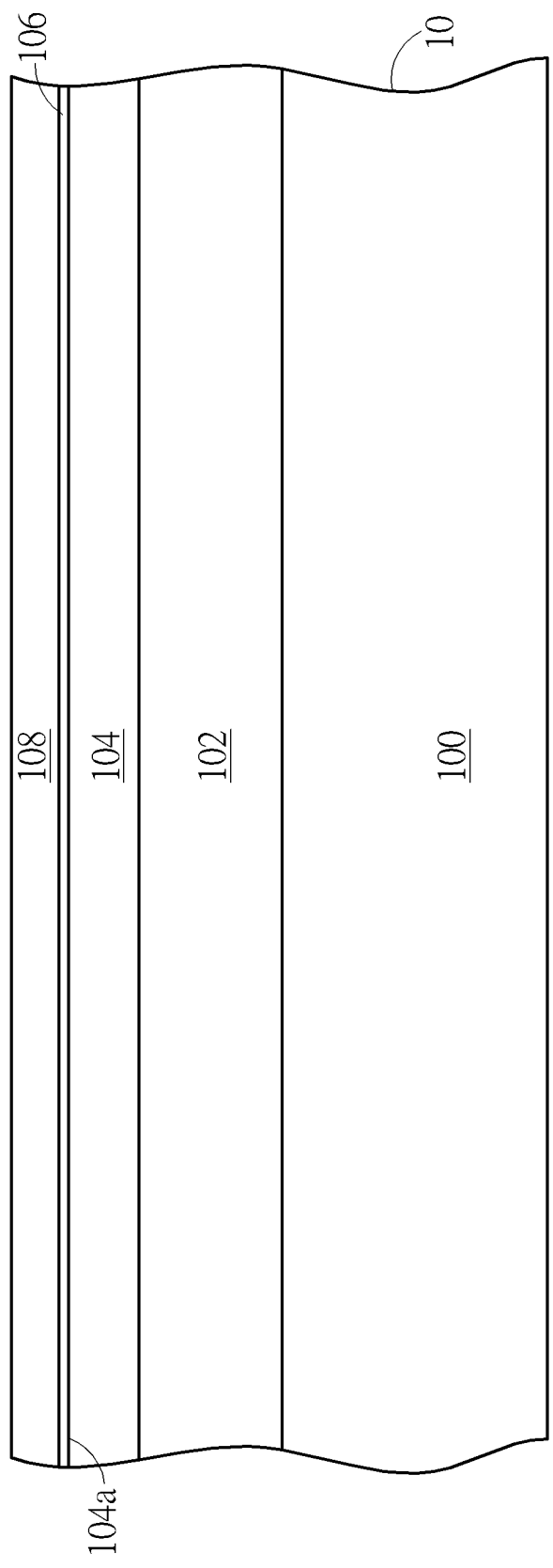
FIG. 1 to FIG. 15 are cross-sectional diagrams showing a method for fabricating a semiconductor device according to one embodiment of the present disclosure.

It should be noted that all the figures are diagrammatic. Relative dimensions and proportions of parts of the drawings are exaggerated or reduced in size, for the sake of clarity and convenience. The same reference signs are generally used to refer to corresponding or similar features in modified and different embodiments.

DETAILED DESCRIPTION

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer, or intervening elements or layers may be present. In contrast, when an element is referred to as being "directly on", "directly connected to" or "directly coupled to" another element or layer, there are no intervening elements or layers present. As used herein, the term "and/or" includes any and all combinations of one or more of the associated listed items.

Embodiments are described herein with reference to cross-section illustrations that are schematic illustrations of idealized embodiments (and intermediate structures). As such, variations from the shapes of the illustrations as a result, for example, of manufacturing techniques and/or tolerances, are to be expected. Thus, these embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Thus, the regions illustrated in the figures are schematic in nature and their shapes are not intended to illustrate the actual shape of a region of a device and are not intended to limit the scope of the embodiments.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

The present disclosure pertains to a buried capacitor and a semiconductor device such as a semiconductor memory device having such buried capacitor, which is particularly suited for DRAM applications. The semiconductor device includes a substrate having a silicon device layer and a buried oxide layer. A transistor is provided on the silicon device layer. The transistor comprises a source region and a drain region, a channel region between the source region and the drain region, and a gate over the channel region. A buried capacitor is embedded in the buried oxide layer and disposed under the silicon device layer. The buried capacitor may have a bottle-shaped structure that laterally extends into the buried oxide layer. The buried capacitor may at least partially overlap with the transistor when viewed from the above. The buried capacitor may comprise inner and outer electrodes with a node dielectric layer therebetween. The source region may be electrically connected to the inner electrode of the buried capacitor. The drain region of the transistor may be electrically connected to a bitline.

FIG. 1 to FIG. 15 are cross-sectional diagrams showing a method for fabricating a semiconductor device with a buried capacitor that is disposed underneath a silicon device layer according to one embodiment of the present disclosure. As shown in FIG. 1, a substrate 10 is provided. According to one embodiment, the substrate 10 may comprise a silicon-on-insulator (SOI) structure comprising, for example, a semiconductor substrate (or a semiconductor layer) 100, a buried oxide layer 102 on the semiconductor substrate 100, and a silicon device layer 104 on the buried oxide layer 102. According to one embodiment, for example, the aforesaid SOI structure may be a SIMOX (Separation by IMplanted OXygen) wafer or a bonded wafer, but not limited thereto. According to one embodiment, for example, the buried oxide layer 102 may comprise silicon oxide.

In some embodiments, the semiconductor substrate 100 may comprise a doped silicon substrate or other semiconductor materials. For example, the semiconductor substrate 100 may be an N-type silicon substrate or an N$^+$-type on top of P-type silicon substrate, but not limited thereto. According to one embodiment, for example, the semiconductor substrate 100 may be an N-type doped silicon substrate, and the silicon device layer 104 may be a P-type silicon layer. According to one embodiment, for example, the silicon device layer 104 may have a thickness of about 50-500 nm, the buried oxide layer 102 may have a thickness of about 300-1000 nm, and the semiconductor substrate 100 may be 50-500 micrometers, but not limited thereto.

According to one embodiment, optionally, a pad oxide layer 106 may be formed on a top surface 104a of the silicon device layer 104. For example, the pad oxide layer 106 may be formed by chemical vapor deposition (CVD) methods or thermal methods known in the art. For example, the pad oxide layer 106 may be a silicon oxide layer and may have a thickness of about 10-50 nm. A nitride layer 108 is then deposited on the pad oxide layer 106. For example, the nitride layer 108 may be a silicon nitride layer and may have a thickness of about 100-300 nm. The nitride layer 108 may be deposited by CVD methods.

Figure 2:
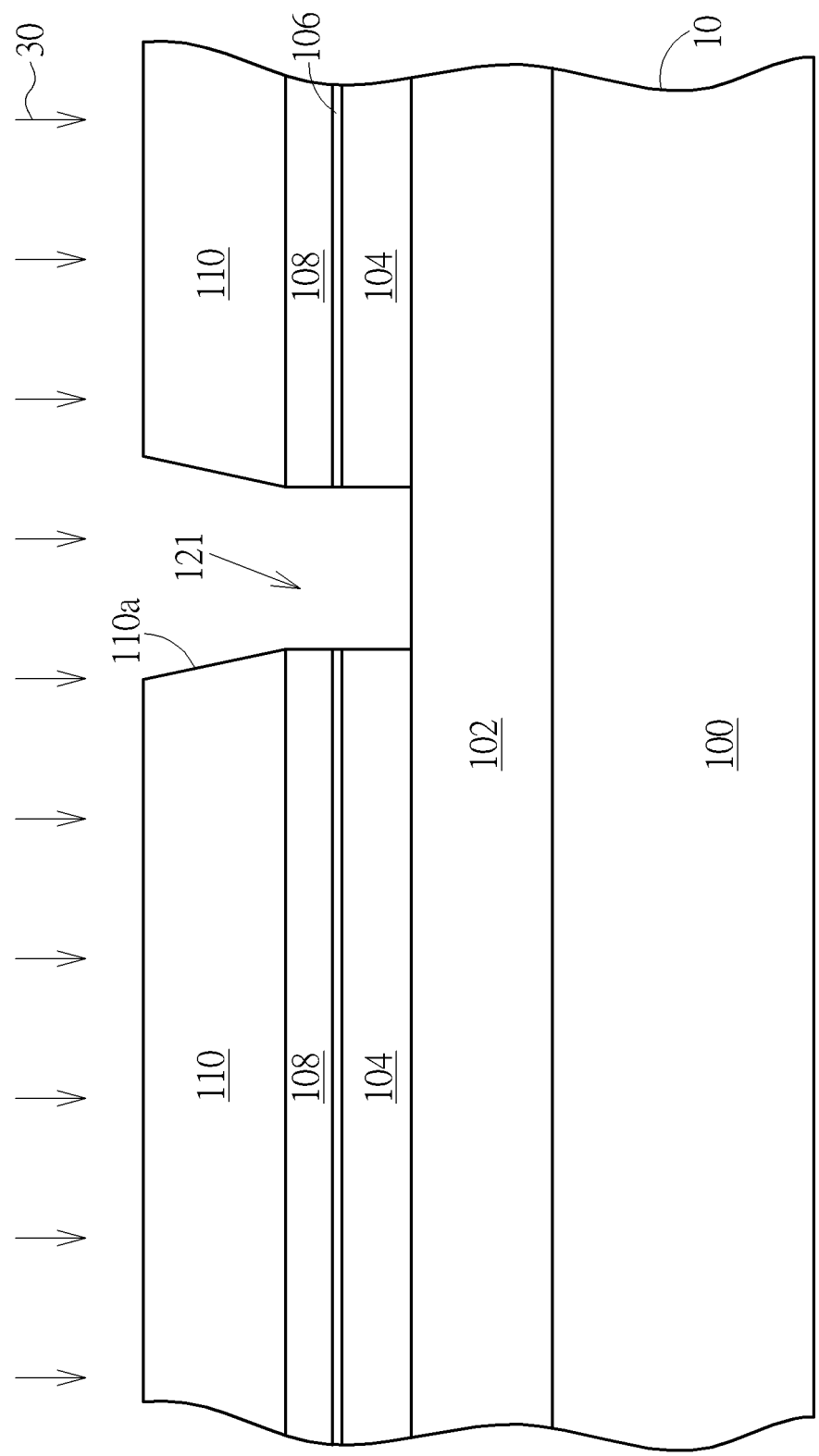

As shown in FIG. 2, a lithographic process may be performed to form a patterned photoresist layer 110 on the nitride layer 108. The patterned photoresist layer 110 comprises an opening 110a that define a capacitor forming area, in which a buried capacitor is to be formed. Subsequently, an anisotropic dry etching process 30 may be performed to etch the nitride layer 108, the pad oxide layer 106 and the silicon device layer 104 through the opening 110a, thereby forming an upper portion 121 extending through the nitride layer 108, the pad oxide layer 106 and the silicon device layer 104. According to one embodiment, for example, the upper portion 121 exposes a portion of the buried oxide layer 102. It is to be understood that when viewed from the above, the shape of the upper portion 121 may comprise a circular shape, an oval shape, or a rectangular shape, but not limited thereto. It is to be understood that a plurality of upper portions arranged in an array may be formed in the substrate 10 although only one upper portion 121 is illustrated in the figures.

Figure 3:
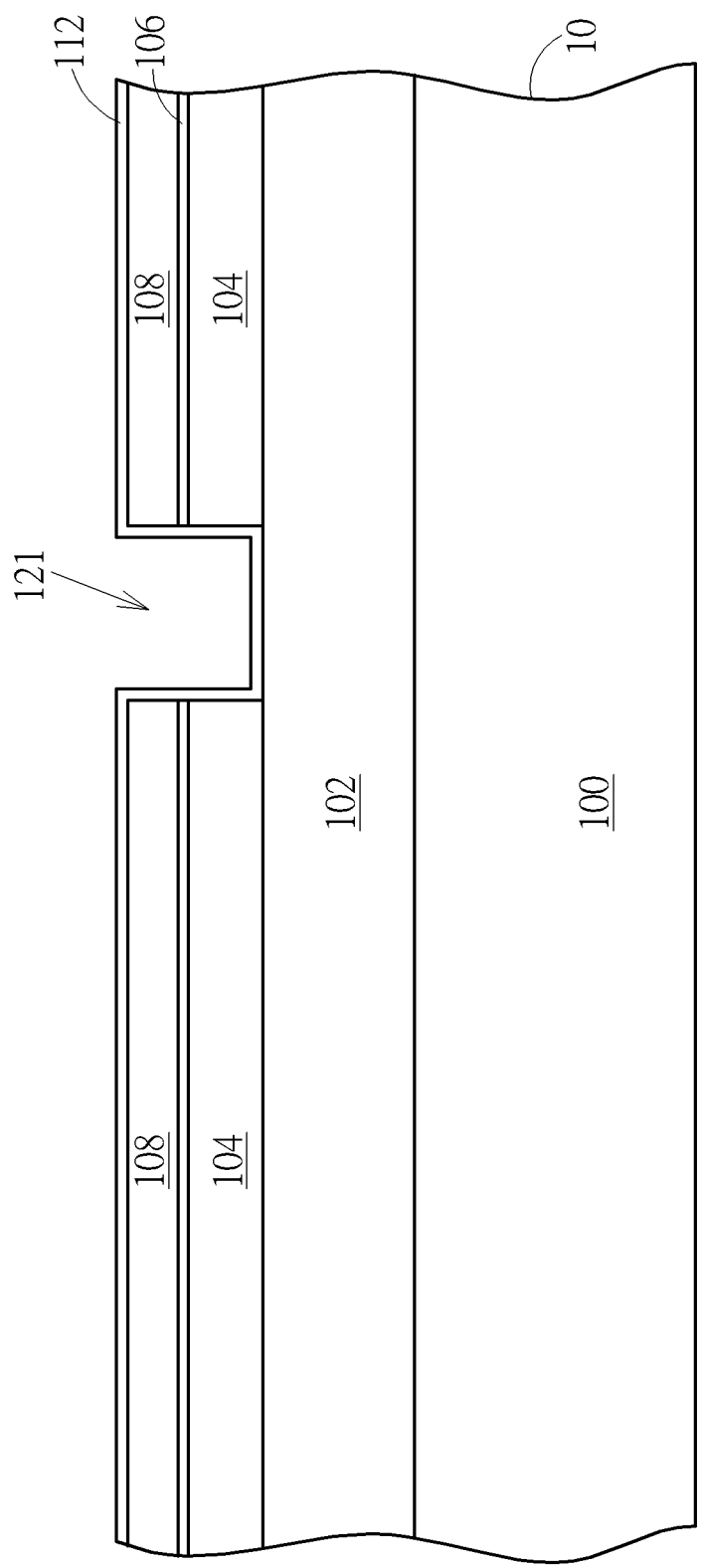

As shown in FIG. 3, the patterned photoresist layer 110 is then removed. Optionally, a conformal nitride layer 112 is deposited on the substrate 10. For example, the nitride layer 112 may be a silicon nitride layer and may have a thickness of about 5-10 nm. The nitride layer 112 may be deposited by CVD methods. The nitride layer 112 conformally covers the top surface of the nitride layer 108 and the interior surface of the upper portion 121. The deposition of the thin nitride layer 112 may be spared if the pad oxide layer 106 is not formed.

Figure 4:
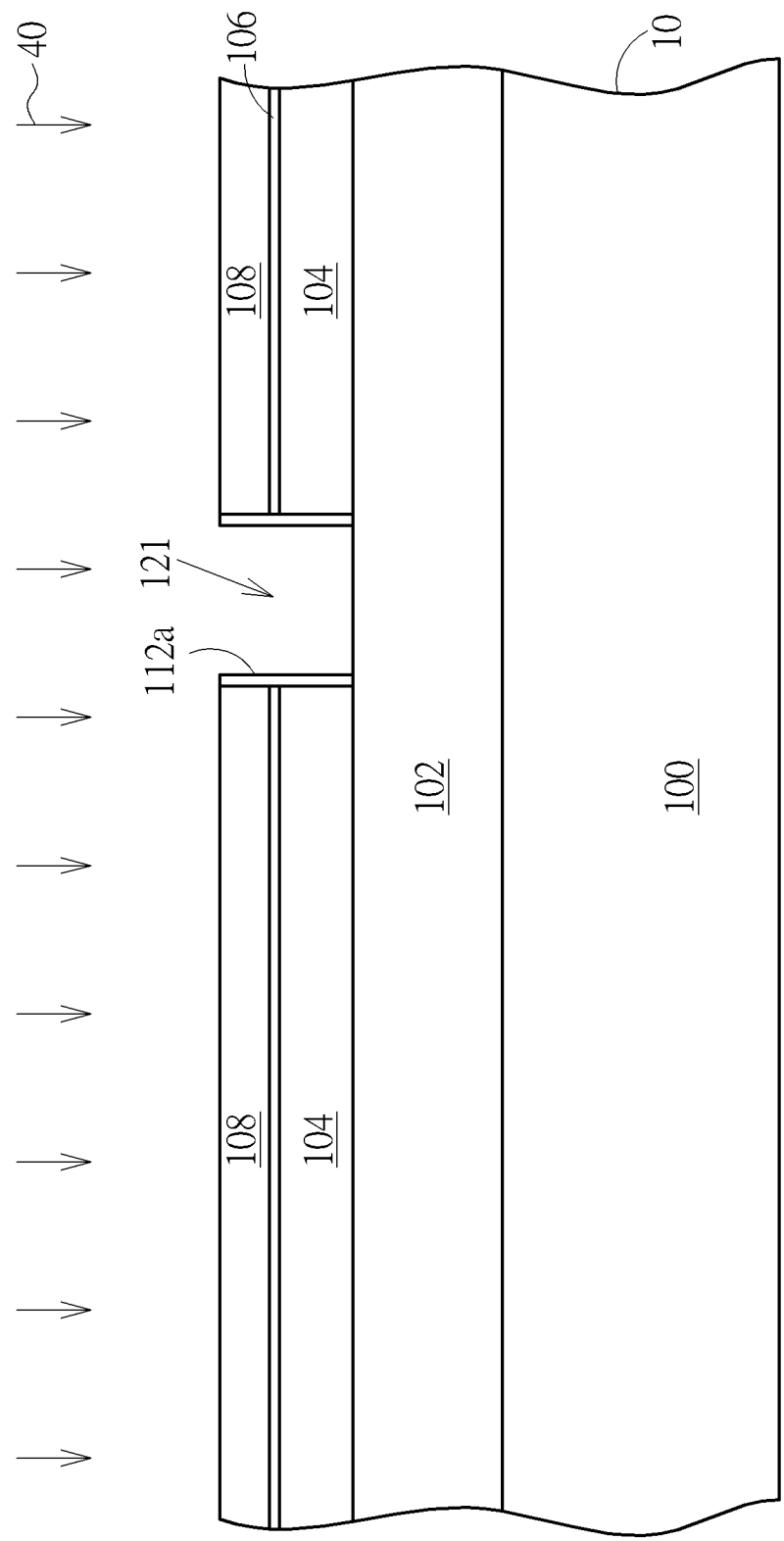

As shown in FIG. 4, an anisotropic etching process 40 is carried out to etch the nitride layer 112, thereby forming a nitride sidewall spacer 112a on the sidewall surface of the upper portion 121. The nitride sidewall spacer 112a protects the side edge of the pad oxide layer 106. It is understood that the aforesaid anisotropic etching process may be skipped if the pad oxide layer 106 is not formed.

Figure 5:
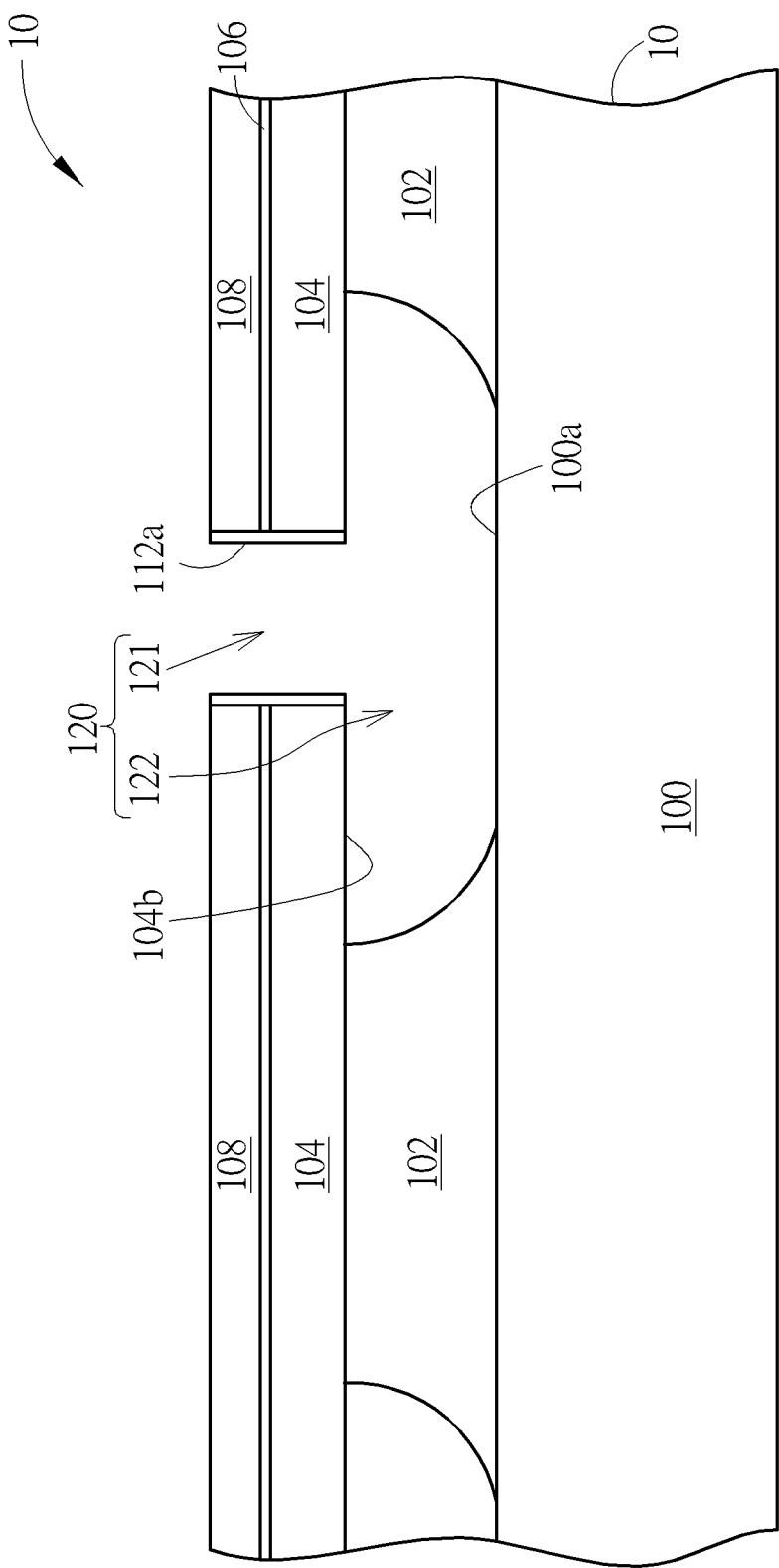

As shown in FIG. 5, subsequently, an isotropic etching process such as wet etching or chemical dry etch (CDE) may be performed to etch the buried oxide layer 102 through the upper portion 121, thereby forming a widened bottom burrow 122 under the silicon device layer 104. According to one embodiment, a portion of the lower surface 104b of the silicon device layer 104 near the upper portion 121 and a portion of the upper surface 100a of the semiconductor substrate 100 may be exposed within the widened bottom burrow 122. The upper portion 121 in the nitride layer 108, the pad oxide layer 106 and the silicon device layer 104, and the widened bottom burrow 122 in the buried oxide layer 102 constitute a bottle-shaped capacitor cavity 120.

Figure 6:
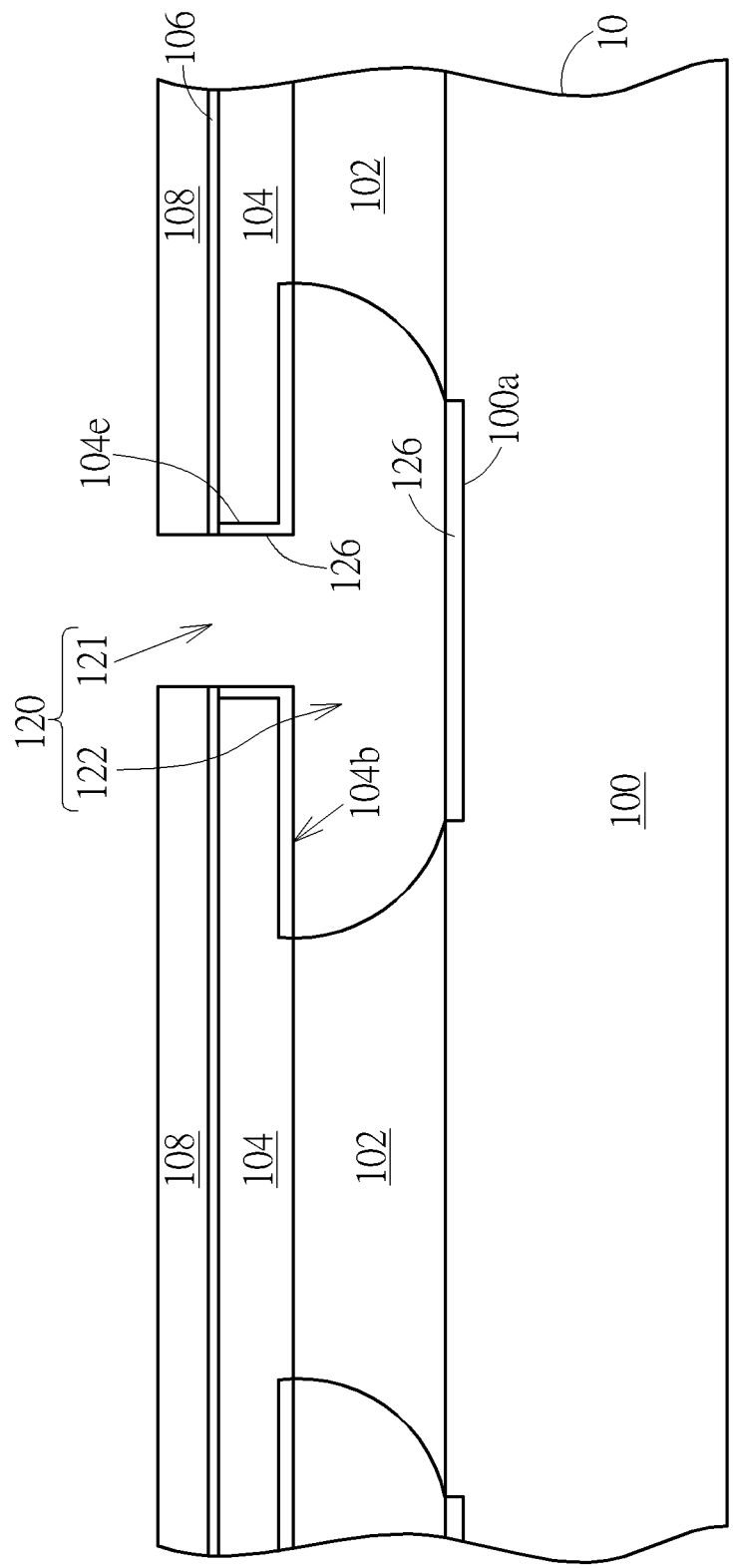

As shown in FIG. 6, after the bottle-shaped capacitor cavity 120 is formed, the nitride sidewall spacer 112a is removed. For example, wet chemistry involving hot phosphoric acid solution may be employed to strip the nitride sidewall spacer 112a. A portion of the nitride layer 108 may be removed when etching the nitride sidewall spacer 112a. Again, this etching step for removing the nitride sidewall spacer 112a may be skipped if the pad oxide layer 106 is not formed.

After the removal of the nitride sidewall spacer 112a, the side edge 104e of the silicon device layer 104 is exposed. Subsequently, a thin oxide layer 126 may be formed on the exposed side edge 104e of the silicon device layer 104, the lower surface 104b of the silicon device layer 104, and the exposed upper surface 100a of the semiconductor substrate 100 within the widened bottom burrow 122. For example, the thin oxide layer 126 may be a silicon oxide layer and may have a thickness of about 2-8 nm. According to one embodiment, the thin oxide layer 126 may be formed by conventional thermal methods. According to another embodiment, the thin oxide layer 126 may be formed by CVD methods such that the thin oxide layer 126 conformally covers the entire interior surface of the bottle-shaped capacitor cavity 120.

Figure 7:
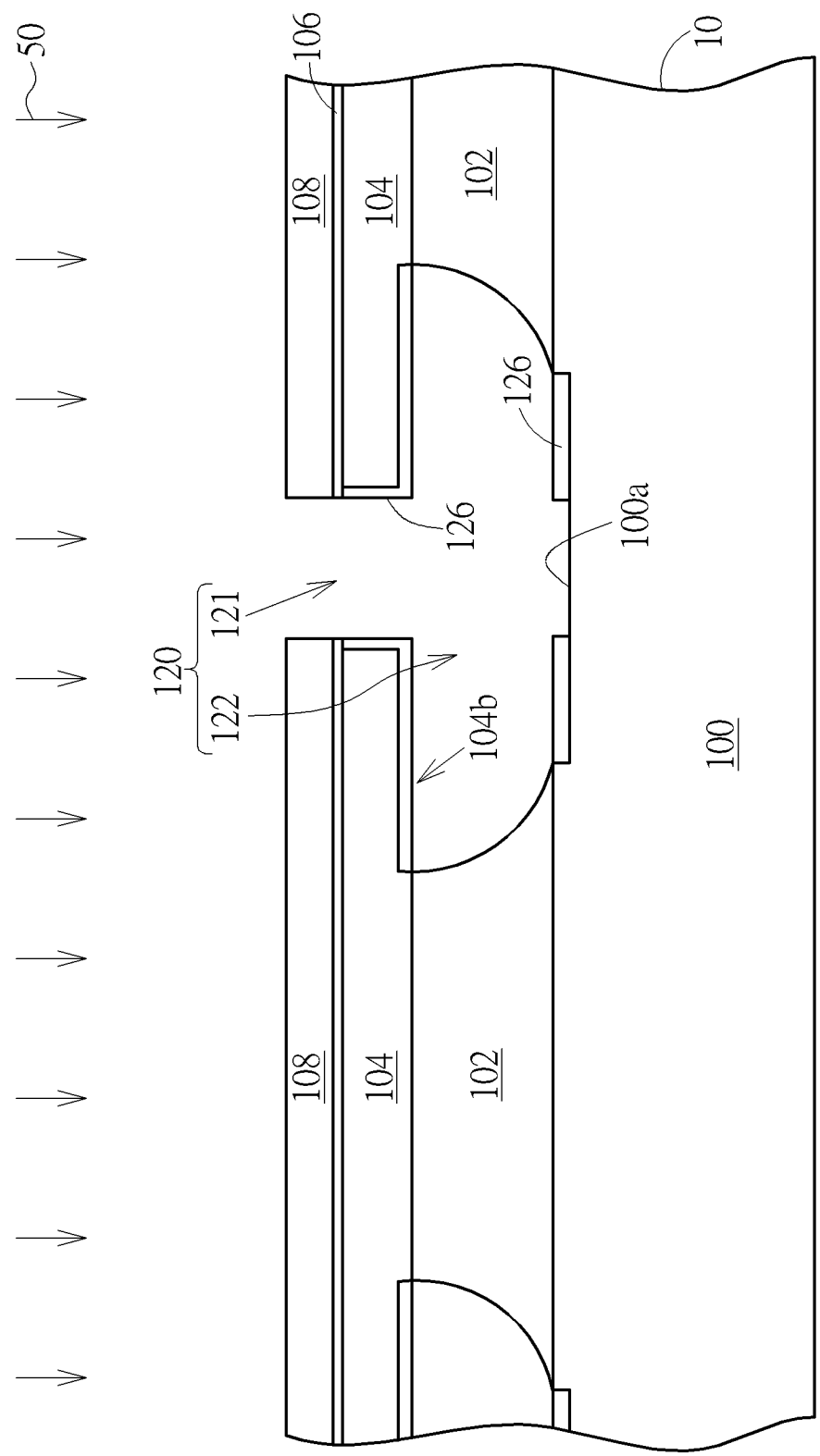

As shown in FIG. 7, optionally, an anisotropic etching process 50 is performed to etch away a portion of the thin oxide layer 126 at the upper surface 100a of the semiconductor substrate 100 within the widened bottom burrow 122 in a self-aligned manner, thereby exposing the portion of the upper surface 100a of the semiconductor substrate 100 that is directly under the upper portion 121.

Figure 8:
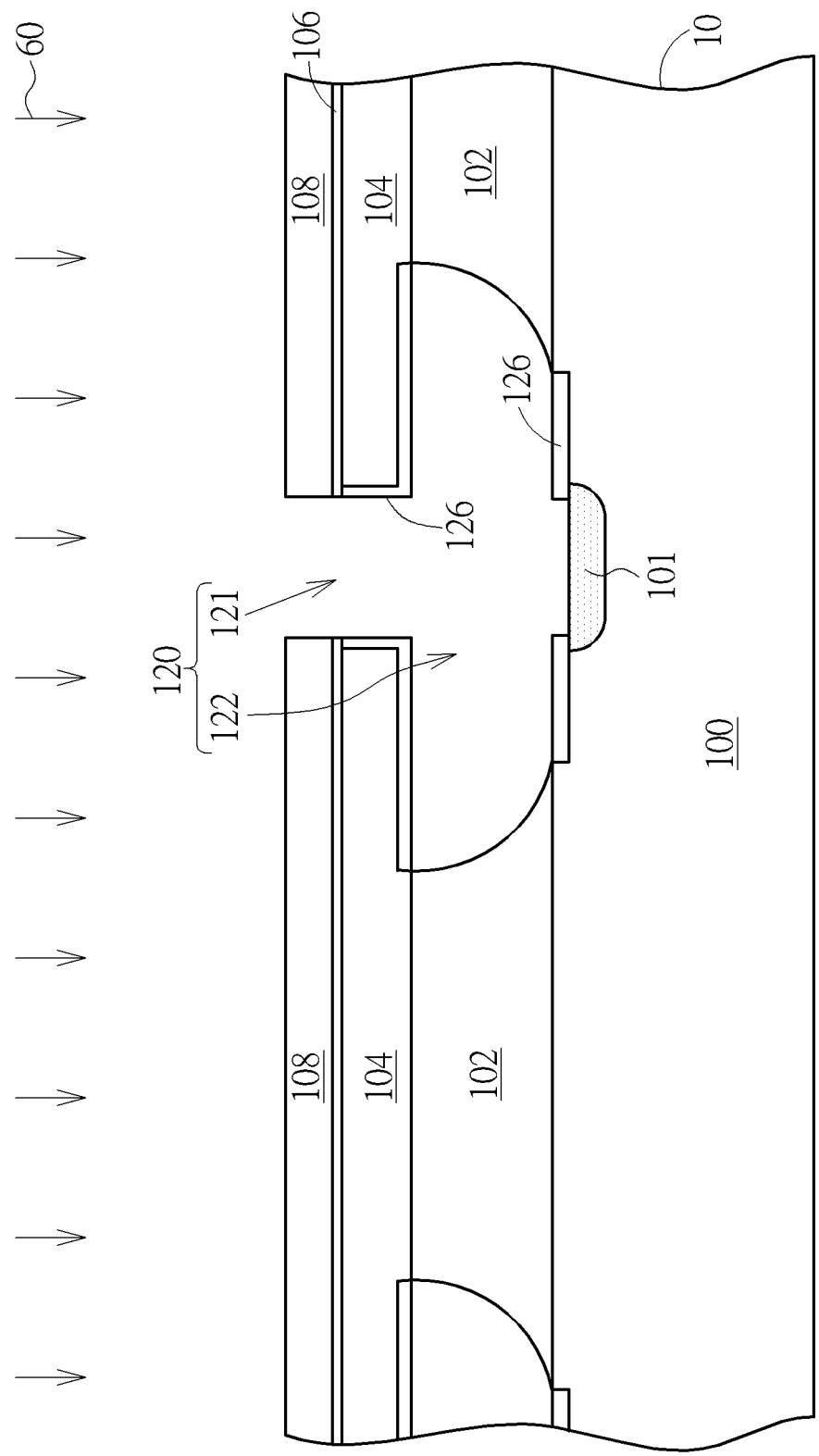

As shown in FIG. 8, optionally, an ion implantation process 60 may be performed to implant N-type dopants such as arsenic (As) or phosphorus (P) into the exposed portion of the upper surface 100a of the semiconductor substrate 100 within the widened bottom burrow 122 in a self-aligned manner, thereby forming an N$^+$ doped region 101 directly under the upper portion 121. According to one embodiment, for example, the ion implantation process 60 may be performed at a dose of about 1E15-5E15 atoms/cm$^2$ and an implant energy of about 5-10 KeV. After the ion implantation process 60 is completed, a rapid thermal annealing (RTA) or furnace annealing may be performed to activate the dopants in the N$^+$ doped region 101 for better Ohmic contact.

Figure 9:
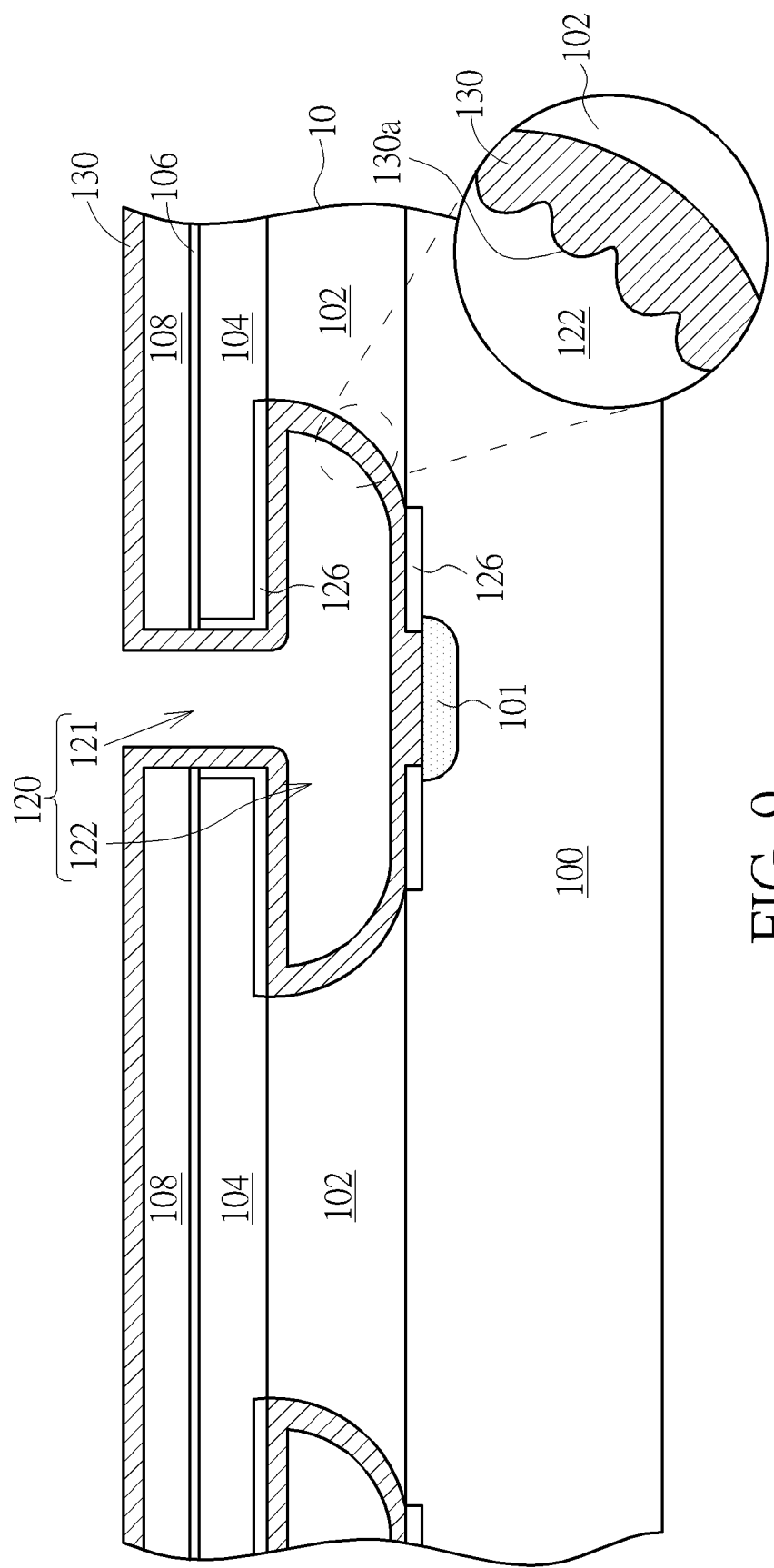

As shown in FIG. 9, a conductive material layer 130 is conformally formed on the nitride layer 108 and on the interior surface of the bottle-shaped capacitor cavity 120. The conductive material layer 130 is in direct contact with the N$^+$ doped region 101. According to one embodiment, for example, the conductive material layer 130 may have a thickness of about 10-50 nm. According to one embodiment, for example, the conductive material layer 130 may comprise W, WSi, Ti, TiN, N-type polysilicon, or combinations thereof. According to one embodiment, preferably, the conductive material layer 130 may be an N-type polysilicon with rugged surface 130a as shown in the enlarged view within the circle region in FIG. 9. For example, the conductive material layer 130 may comprise an N-type hemispherical grained (HSG) silicon layer. According to one embodiment, for example, the conductive material layer 130 may by formed by CVD or atomic layer deposition (ALD) methods.

Figure 10:
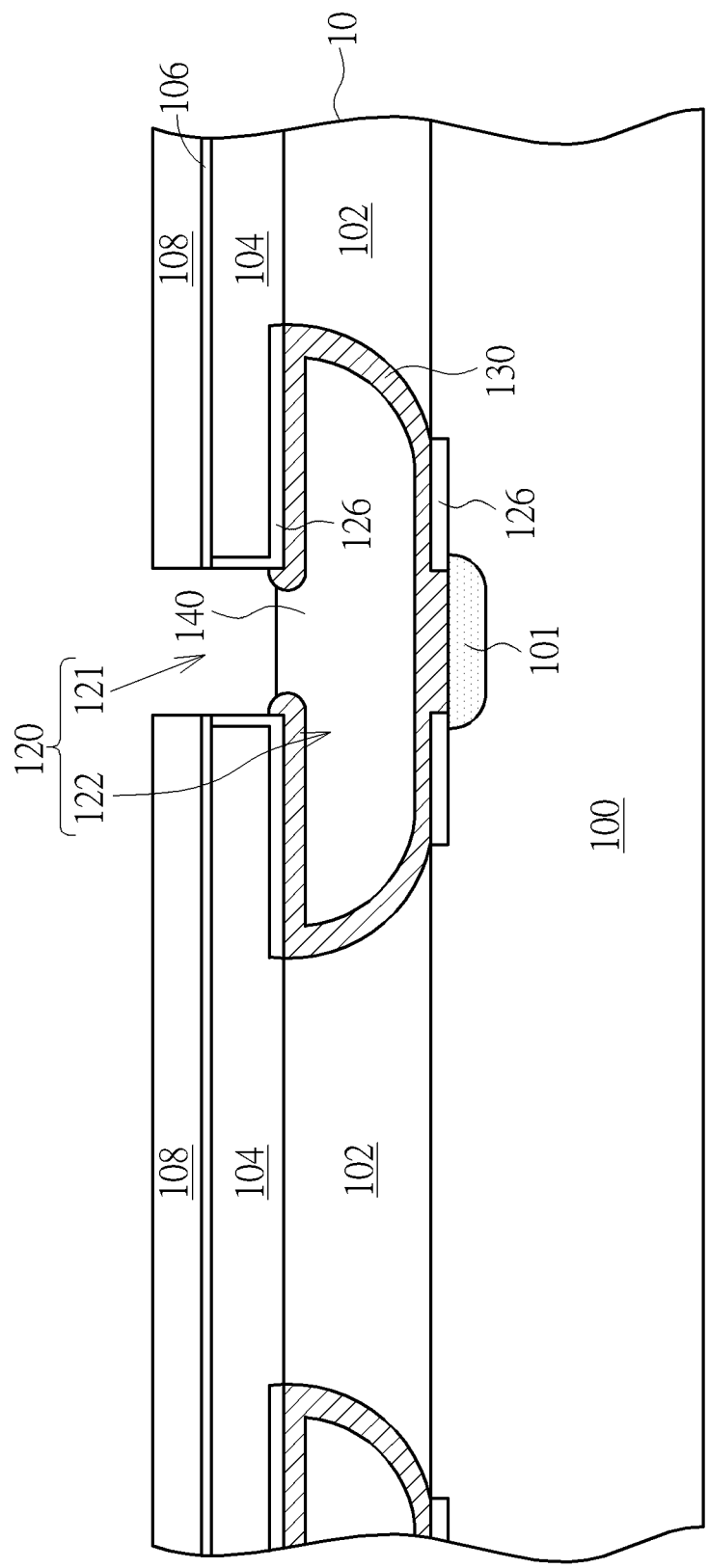

As shown in FIG. 10, subsequently, the bottle-shaped capacitor cavity 120 is filled with a sacrificial material layer 140. For example, the sacrificial material layer 140 may comprise a spin-on material or a photoresist layer, but not limited thereto. According to one embodiment, for example, the sacrificial material layer 140 may be further subjected to a baking or curing process. An etching process is then performed to recess the sacrificial material layer 140 down to a horizontal level that is slightly higher than the interface between the silicon device layer 104 and the buried oxide layer 102. The conductive material layer 130 above the top surface of the recessed sacrificial material layer 140 is exposed. An etching process such as an isotropic etching process including, but not limited to, wet chemical etch or CDE, is performed to remove the exposed conductive material layer 130 that is not covered by the recessed sacrificial material layer 140.

Figure 11:
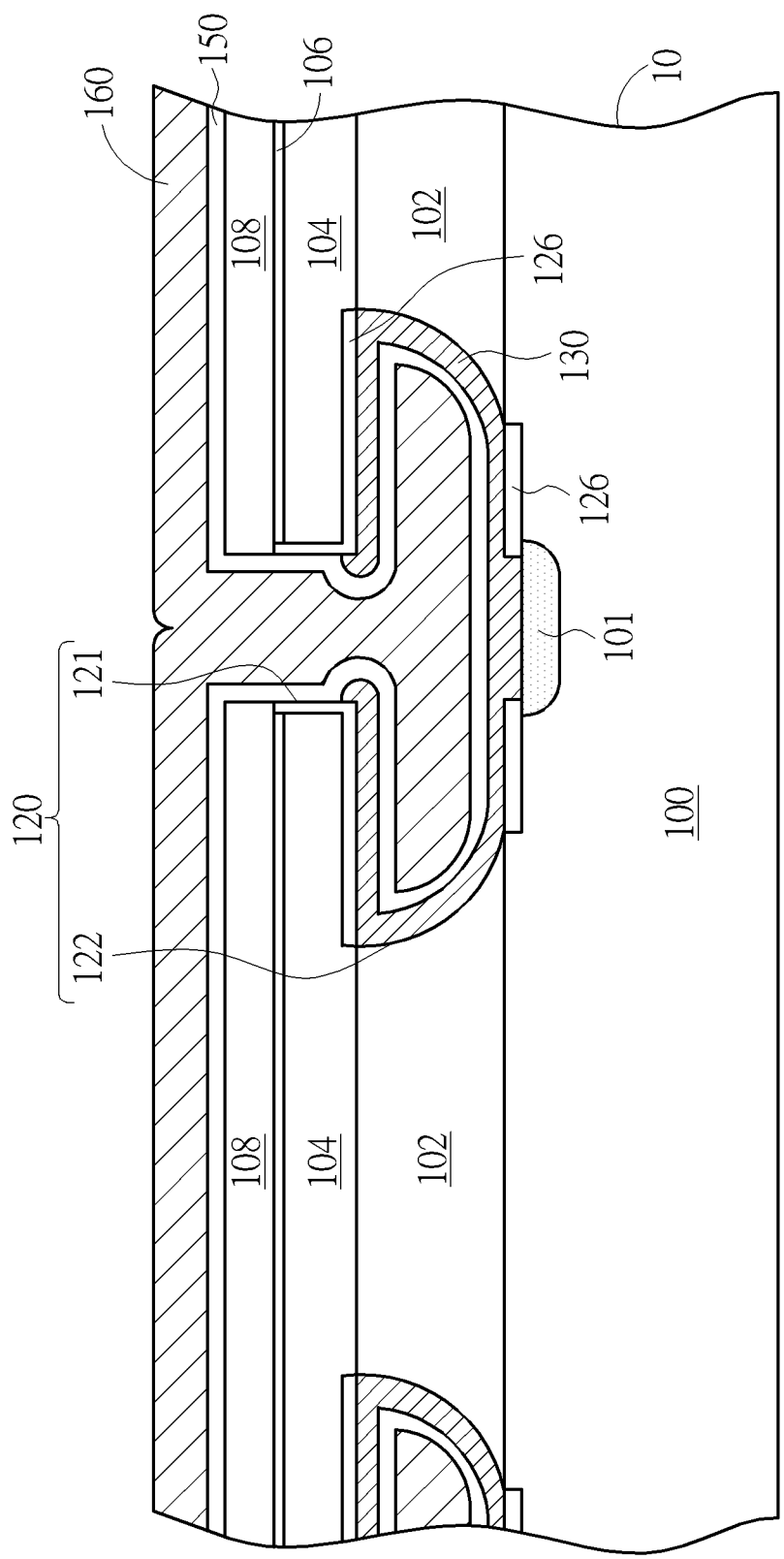

As shown in FIG. 11, the remaining sacrificial material layer 140 is completely removed from the bottle-shaped capacitor cavity 120. Thereafter, a capacitor dielectric layer 150 is conformally deposited on the nitride layer 108 and on the interior surface of the bottle-shaped capacitor cavity 120. The capacitor dielectric layer 150 covers the conductive material layer 130 within the bottle-shaped capacitor cavity 120. According to one embodiment, for example, the capacitor dielectric layer 150 may comprise silicon oxide, silicon nitride, or high-k dielectric known in the art. According to one embodiment, for example, the capacitor dielectric layer 150 may have a thickness of about 2-10 nm. Subsequently, the remaining space within the bottle-shaped capacitor cavity 120 is filled up with a conductive material layer 160. According to one embodiment, for example, the conductive material layer 160 may have a thickness of about 150-500 nm. According to one embodiment, for example, the conductive material layer 160 may comprise W, WSi, Ti, TiN, N-type polysilicon, or combinations thereof.

Figure 12:
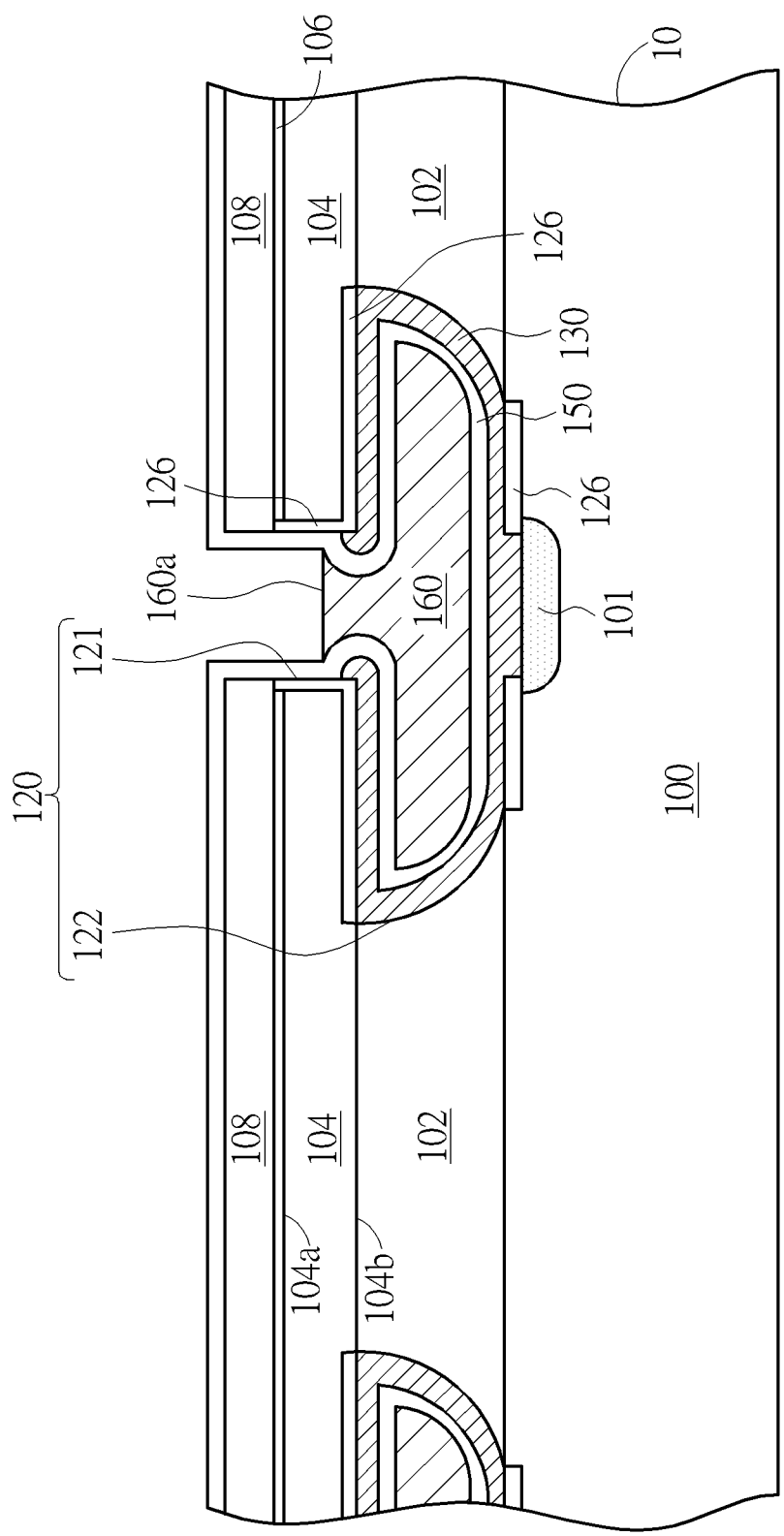

As shown in FIG. 12, optionally, a chemical mechanical polishing (CMP) process is then performed to planarize the top surface of the conductive material layer 160. After the CMP process, the conductive material layer 160 is etched back and recessed to a horizontal level that is somewhere between the upper surface 104a and lower surface 104b of the silicon device layer 104. At this point, the top surface 160a of the recessed conductive material layer 160 is disposed within the bottle-shaped capacitor cavity 120 and below the pad oxide layer 106.

Figure 13:
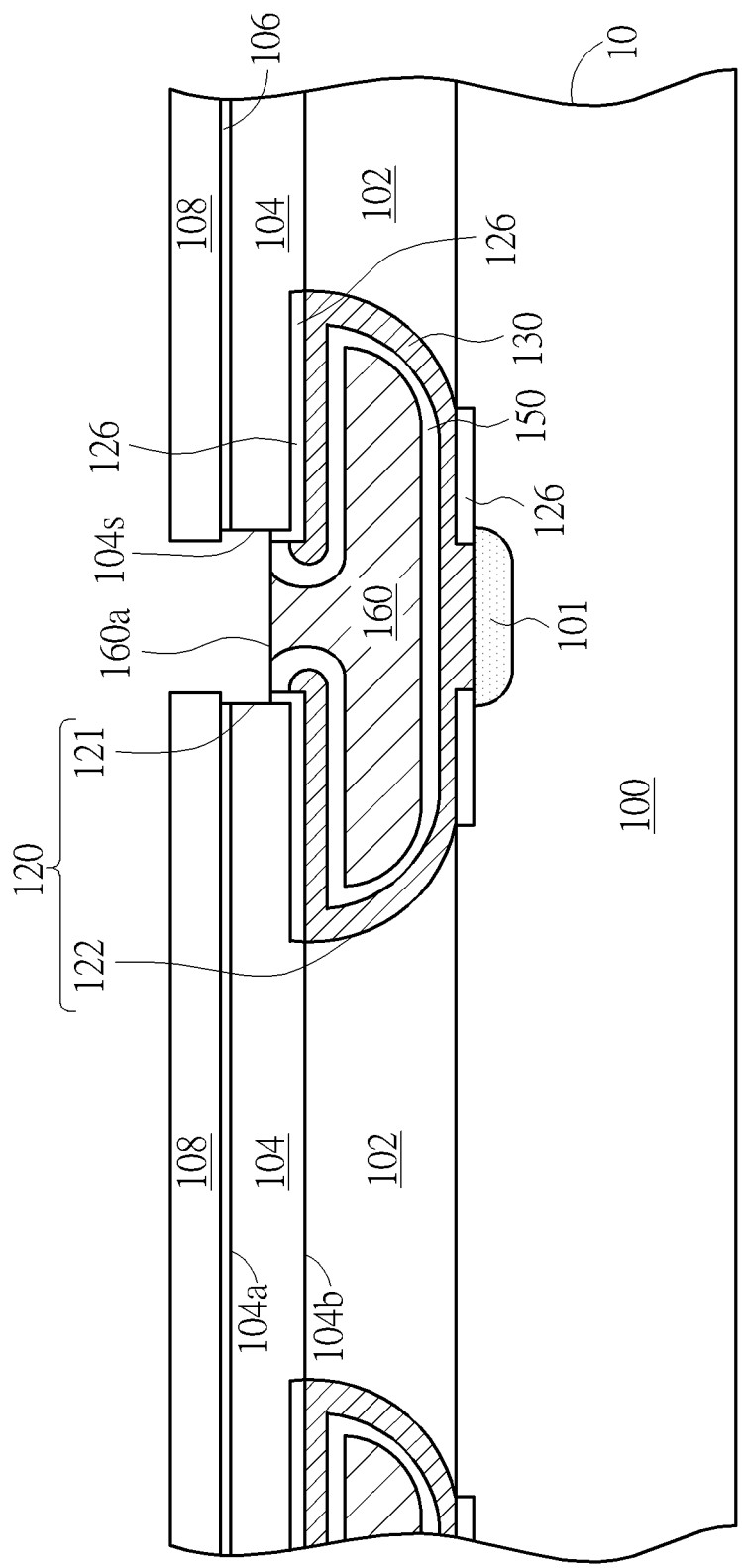

As shown in FIG. 13, after recessing the conductive material layer 160, the capacitor dielectric layer 150 that is not covered by the conductive material layer 160 is removed. The thin oxide layer 126 above the top surface 160a of the recessed conductive material layer 160 and a portion of the pad oxide layer 106 around the bottle-shaped capacitor cavity 120 are removed to expose a sidewall surface 104s of the silicon device layer 104. An etching process such as an isotropic etching process including, but not limited to, wet chemical etch or CDE, is performed to remove the capacitor dielectric layer 150, the thin oxide layer 126 and the pad oxide layer 106.

Figure 14:
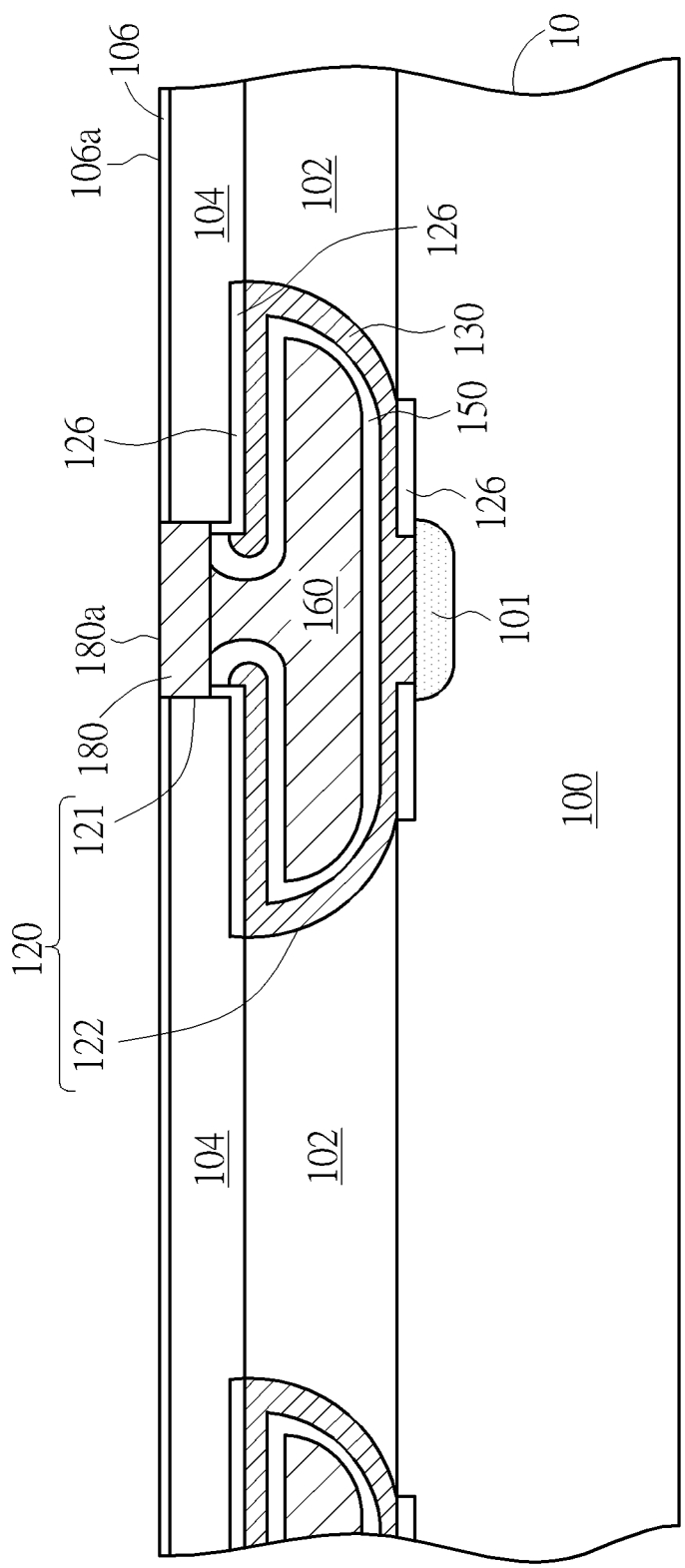

As shown in FIG. 14, the nitride layer 108 is removed. The upper surface 106a of the pad oxide layer 106 is revealed. A conductive material layer 180 is then deposited over the substrate 10 in a blanket manner. According to one embodiment, for example, the conductive material layer 160 may comprise W, WSi, Ti, TiN, N-type polysilicon, or combinations thereof. The remaining space within the bottle-shaped capacitor cavity 120 above the top surface 160a of the recessed conductive material layer 160 is filled with the conductive material layer 180. According to one embodiment, the conductive layer 150 is in direct contact with the top surface 160a of the recessed conductive material layer 160 and in direct contact with the sidewall surface 104s of the silicon device layer 104.

After the deposition of the conductive material layer 180, a planarization process may be performed to render the upper surface 180a of the conductive material layer 180 within the bottle-shaped capacitor cavity 120 coplanar with the upper surface 106a of the pad oxide layer 106. According to one embodiment, for example, the planarization process may be a CMP process or an etch-back process. According to another embodiment, the nitride layer 108 may be removed after the formation and etch-back of the conductive material layer 180.

Figure 15:
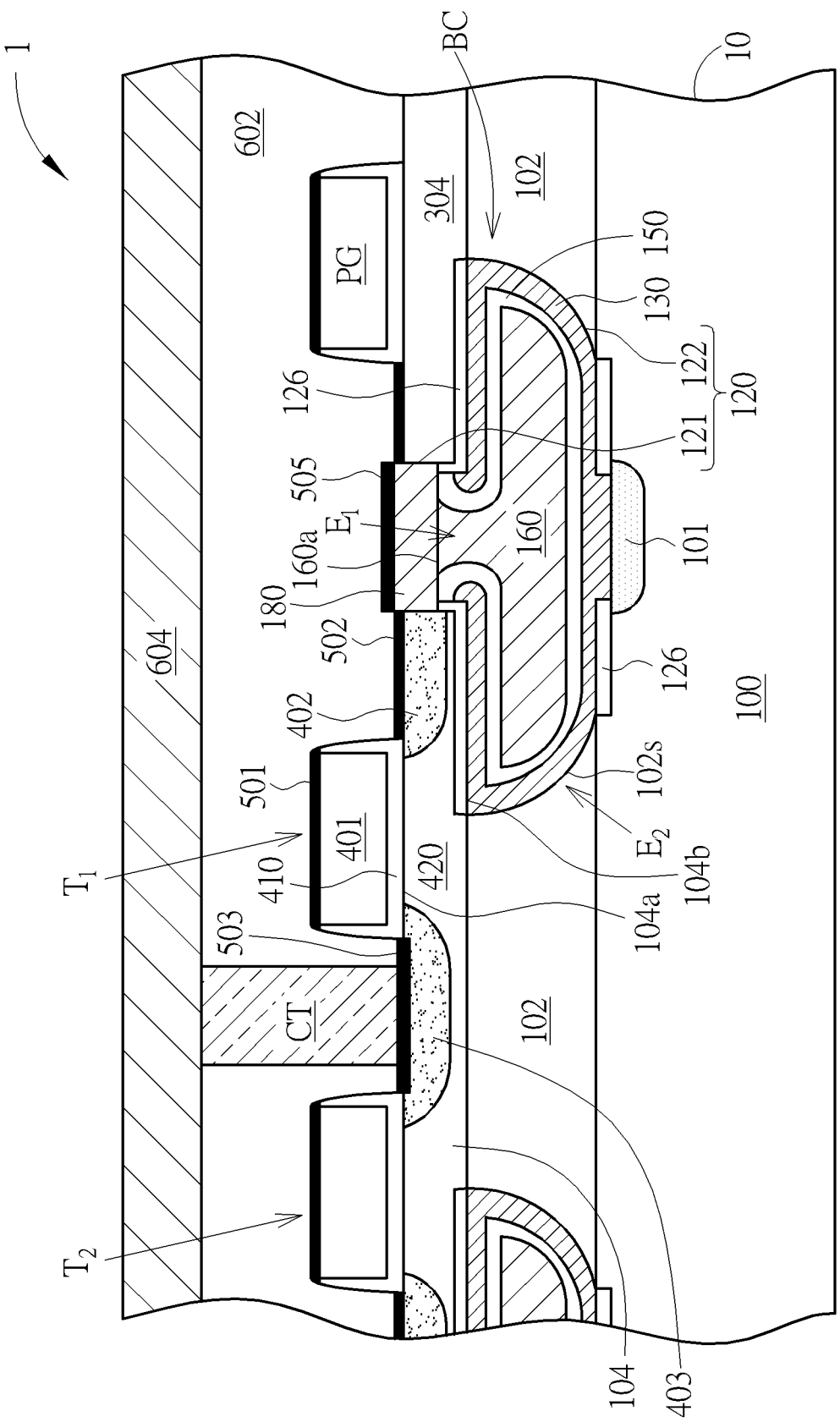

As shown in FIG. 15, after removing the conductive material layer 180 outside the bottle-shaped capacitor cavity 120, the pad oxide layer 106 is then removed by using an isotropic etching process. After removing the pad oxide layer 106, the upper surface 104a of the silicon device layer 104 is revealed. According to one embodiment, for example, the upper surface 180a of the conductive material layer 180 may be slightly higher than the upper surface 104a of the silicon device layer 104. At this point, a buried capacitor BC is formed within the bottle-shaped capacitor cavity 120. The buried capacitor BC comprises the inner electrode $E_1$ comprised of the conductive material layer 160, an outer electrode $E_2$ comprised of the conductive material layer 130, and the capacitor dielectric layer 150 between the inner electrode $E_1$ and the outer electrode $E_2$. The capacitor dielectric layer 150 surrounds the inner electrode $E_1$. The conductive material layer 180 buried in the bottle-shaped capacitor cavity 120 is situated atop the inner electrode $E_1$ and may function as a buried strap that electrically connects the inner electrode $E_1$ with the silicon device layer 104. The bottle-shaped capacitor cavity 120 increases the capacitor surface area without the need of forming the deep trench as the geometry gets smaller and smaller. The shallower bottle-shaped buried capacitor also reduces the serial resistance and improves the device performance.

Subsequently, several fabrication processes for making semiconductor circuit elements on the silicon device layer 104 are performed to complete the formation of the semiconductor device 1. For example, a shallow trench isolation (STI) process is carried out to form STI region 304 in the silicon device layer 104 so as to define active areas of the silicon device layer 104, on which the semiconductor circuit elements such as metal-oxide-semiconductor (MOS) transistors $T_1$, $T_2$ are fabricated. The two exemplary MOS transistors $T_1$, $T_2$ may function as select transistors. Each of the two exemplary MOS transistors $T_1$, $T_2$ comprises a gate 401, an N-type source region 402, an N-type drain region 403, a gate oxide layer 410 under the gate 401. For example, the two exemplary mirror-symmetric MOS transistors $T_1$, $T_2$ share the N-type drain region 403. Silicide layers 501, 502, 503, and 505 may be formed on the gate 401, the N-type source region 402, the N-type drain region 403, and the conductive material layer 180, respectively. The N-type source region 402 is electrically connected to the conductive material layer 180. The silicide layer 505 on the conductive material layer 180 may be in direct contact with the silicide layer 502 on the N-type source region 402.

It is understood that the two exemplary MOS transistors $T_1$, $T_2$ may be planar-type transistor or fin-type transistors. In some embodiments, the N-type source region 402 and the N-type drain region 403 may have the same depth that is greater than or equal to the total thickness of the silicon device layer 104.

According to one embodiment, a passing gate PG may be formed on the STI region 304. An inter-layer dielectric (ILD) layer 602 may be deposited in a blanket manner to cover the two exemplary MOS transistors $T_1$, $T_2$ and the passing gate PG. A contact plug CT may be formed in the ILD layer 602. The contact plug CT is electrically connected to the N-type drain region 403. For example, the contact plug CT may be a tungsten plug, but not limited thereto. A bit line 604 is formed on the ILD layer 602 and is electrically connected to the contact plug CT. The bit line 604 may be a metal line that is formed by metal interconnection processes. For example, the bit line 604 may be a damascened copper metal line.

Structurally speaking, as shown in FIG. 15, the semiconductor device 1 such as a DRAM cell is fabricated on the substrate 10 comprising the semiconductor substrate 100, the buried oxide layer 102 on the semiconductor layer 100, and the silicon device layer 104 on the buried layer 102. At least one bottle-shaped capacitor cavity 120 extends through the silicon device layer 104 and the buried oxide layer 102. The at least one bottle-shaped capacitor cavity 120 is comprised of the upper portion 121 situated in the silicon device layer 104 and the widened bottom burrow 122 situated in the buried oxide layer 102. The widened bottom burrow 122 is wider than the upper portion 121. At least one buried capacitor BC is located in the at least one bottle-shaped capacitor cavity 120. The at least one buried capacitor BC comprises the inner electrode $E_1$ and the outer electrode $E_2$ with the capacitor dielectric layer 150 therebetween. At least one transistor $T_1$ is disposed on the substrate 10. The at least one transistor $T_1$ comprises the source region 402 and the drain region 403 in the silicon device layer 104, a channel region 420 between the source region 402 and the drain region 403, and a gate 401 over the channel region 420. The source region 402 is electrically connected to the inner electrode $E_1$ of the at least one buried capacitor BC.

The lower surface 104b of the silicon device layer 104, a side surface 102s of the buried oxide layer 102 and the upper surface 100a of the semiconductor substrate 100 constitute an interior surface of the widened bottom burrow 122. The outer electrode $E_2$ conformally covers the lower surface 104b of the silicon device layer 104, the side surface 102s of the buried oxide layer 102 and the upper surface 100a of the semiconductor substrate 100 within the widened bottom burrow 122.

The oxide layer 126 is disposed on the lower surface 104b of the silicon device layer 104 and the upper surface 100a of the semiconductor substrate 100 within the widened bottom burrow 122. The oxide layer 126 has a thickness of about 2-8 nm. The outer electrode $E_2$ is in direct contact with the oxide layer 126 within the widened bottom burrow 122.

The semiconductor device 1 further comprises the $N^+$ doped region 101 disposed in the upper surface 100a of the semiconductor substrate 100 within the widened bottom burrow 122. The outer electrode $E_2$ is in direct contact with the $N^+$ doped region 101 within the widened bottom burrow 122.

The outer electrode $E_2$ protrudes beyond a sidewall surface of the upper portion 121. The outer electrode $E_2$ comprises an N-type polysilicon with rugged surface 130a (shown in FIG. 9). The widened bottom burrow 122 is completely filled with the outer electrode $E_2$, the capacitor dielectric layer 10 and the inner electrode $E_1$.

According to some embodiments, the semiconductor device 1 further comprises the conductive material layer 180 embedded within the upper portion 121, wherein the inner electrode $E_1$ is in direct contact with the conductive material layer 180. According to some embodiments, the source region 402 is electrically connected to the conductive material layer 180.

According to some embodiments, the semiconductor device further comprises a silicide layer 505 on a top surface of the conductive material layer 180, and a silicide layer 502 on the source region 402. The silicide layer 502 and the silicide layer 505 are not coplanar with each other.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
   a substrate comprising a semiconductor substrate, a buried oxide layer on said semiconductor substrate, and a silicon device layer on said buried layer;
   at least one bottle-shaped capacitor cavity extending through said silicon device layer and said buried oxide layer, wherein said at least one bottle-shaped capacitor cavity is comprised of an upper portion disposed in said silicon device layer and a widened bottom burrow disposed in said buried oxide layer and underneath the silicon device layer, wherein said widened bottom burrow is wider than said upper portion;

at least one buried capacitor located in said at least one bottle-shaped capacitor cavity, said at least one buried capacitor comprising an inner electrode and an outer electrode with a capacitor dielectric layer therebetween;

at least one transistor disposed on said substrate, wherein said at least one transistor comprises a source region and a drain region disposed in said silicon device layer, a channel region between said source region and said drain region, and a gate over said channel region, and wherein said source region is electrically connected to said inner electrode of said at least one buried capacitor; and a conductive material layer embedded within said upper portion, wherein said inner electrode is in direct contact with said conductive material layer.

2. The semiconductor device according to claim 1, wherein said outer electrode protrudes beyond a sidewall surface of said upper portion.

3. The semiconductor device according to claim 1, wherein said outer electrode comprises an N-type polysilicon with rugged surface.

4. The semiconductor device according to claim 1, wherein said widened bottom burrow is completely filled with said outer electrode, said capacitor dielectric layer and said inner electrode.

5. The semiconductor device according to claim 1, wherein said source region is electrically connected to the conductive material layer.

6. The semiconductor device according to claim 1 further comprising:
a silicide layer on said source region, said drain region, said gate and said conductive material layer.

7. The semiconductor device according to claim 1, wherein a lower surface of said silicon device layer, a side surface of said buried oxide layer and an upper surface of said semiconductor substrate constitute an interior surface of said widened bottom burrow.

8. The semiconductor device according to claim 7, wherein said outer electrode conformally covers said lower surface of said silicon device layer, said side surface of said buried oxide layer and said upper surface of said semiconductor substrate within said widened bottom burrow.

9. The semiconductor device according to claim 8, wherein an oxide layer is disposed on said lower surface of said silicon device layer and said upper surface of said semiconductor substrate within said widened bottom burrow.

10. The semiconductor device according to claim 9, wherein said oxide layer has a thickness of about 2-8 nm.

11. The semiconductor device according to claim 9, wherein said outer electrode is in direct contact with said oxide layer within said widened bottom burrow.

12. The semiconductor device according to claim 7 further comprising:
an $N^+$ doped region disposed in said upper surface of said semiconductor substrate within said widened bottom burrow.

13. The semiconductor device according to claim 12, wherein said outer electrode is in direct contact with said $N^+$ doped region within said widened bottom burrow.

14. A method for forming a semiconductor device, comprising:

providing a substrate comprising a semiconductor substrate, a buried oxide layer on said semiconductor substrate, and a silicon device layer on said buried layer;

forming at least one bottle-shaped capacitor cavity extending through said silicon device layer and said buried oxide layer, wherein said at least one bottle-shaped capacitor cavity is comprised of an upper portion disposed in said silicon device layer and a widened bottom burrow disposed in said buried oxide layer and underneath the silicon device layer, wherein said widened bottom burrow is wider than said upper portion;

forming at least one buried capacitor in said at least one bottle-shaped capacitor cavity, said at least one buried capacitor comprising an inner electrode and an outer electrode with a capacitor dielectric layer therebetween;

forming a conductive material layer embedded within said upper portion, wherein said inner electrode is in direct contact with said conductive material layer; and forming at least one transistor on said substrate, wherein said at least one transistor comprises a source region and a drain region disposed in said silicon device layer, a channel region between said source region and said drain region, and a gate over said channel region, and wherein said source region is electrically connected to said inner electrode of said at least one buried capacitor.

15. The method according to claim 14, wherein said outer electrode protrudes beyond a sidewall surface of said upper portion.

16. The method according to claim 14, wherein said outer electrode comprises an N-type polysilicon with rugged surface.

17. The method according to claim 14, wherein said widened bottom burrow is completely filled with said outer electrode, said capacitor dielectric layer and said inner electrode.

18. The method according to claim 14, wherein said source region is electrically connected to the conductive material layer.

19. The method according to claim 14 further comprising:
forming a silicide layer on said source region, said drain region, said gate and said conductive material layer.

20. The method according to claim 14, wherein a lower surface of said silicon device layer, a side surface of said buried oxide layer and an upper surface of said semiconductor substrate constitute an interior surface of said widened bottom burrow.

21. The method according to claim 20, wherein said outer electrode conformally covers said lower surface of said silicon device layer, said side surface of said buried oxide layer and said upper surface of said semiconductor substrate within said widened bottom burrow.

22. The method according to claim 21 further comprising:
forming an oxide layer on said lower surface of said silicon device layer and said upper surface of said semiconductor substrate within said widened bottom burrow.

23. The method according to claim 22, wherein said oxide layer has a thickness of about 2-8 nm.

24. The method according to claim 22, wherein said outer electrode is in direct contact with said oxide layer within said widened bottom burrow.

25. The method according to claim 20 further comprising:
forming an $N^+$ doped region in said upper surface of said semiconductor substrate within said widened bottom burrow.

26. The method according to claim 25, wherein said outer electrode is in direct contact with said $N^+$ doped region within said widened bottom burrow.

\* \* \* \* \*